(12) United States Patent
Wolf

(10) Patent No.: US 9,312,607 B2
(45) Date of Patent: Apr. 12, 2016

(54) LOAD SPREADING INTERPOSER

(71) Applicant: Raytheon Company, Waltham, MA (US)

(72) Inventor: Steven R. Wolf, Dallas, TX (US)

(73) Assignee: RAYTHEON COMPANY, Waltham, MA (US)

(*) Notice: Subject to any disclaimer, the term of this patent is extended or adjusted under 35 U.S.C. 154(b) by 390 days.

(21) Appl. No.: 13/765,013

(22) Filed: Feb. 12, 2013

(65) Prior Publication Data

US 2014/0226263 A1 Aug. 14, 2014

(51) Int. Cl.
| | | |
|---|---|---|
| *H05K 5/02* | (2006.01) |
| *H01Q 21/00* | (2006.01) |
| *H01R 12/71* | (2011.01) |
| *H05K 7/10* | (2006.01) |

(52) U.S. Cl.
CPC ............ *H01Q 21/0025* (2013.01); *H01R 12/71* (2013.01); *H05K 5/0247* (2013.01); *H05K 7/10* (2013.01)

(58) Field of Classification Search
CPC ..... H05K 3/0058; H05K 5/00; H05K 5/0004; H05K 5/0043; H05K 5/0052; H05K 7/00; H05K 2201/10598; H05K 7/10; H05K 5/0247; H01R 12/71; H04B 1/40
USPC ............ 361/728, 679.01, 739, 748, 752, 753, 361/758, 760, 803, 807, 809, 810, 715, 719, 361/721–724, 736, 735, 785, 795, 767; 455/349, 90.2; 340/314–315; 174/255, 174/256, 260, 261, 138 G; 439/55; 385/14
See application file for complete search history.

(56) References Cited

U.S. PATENT DOCUMENTS

| | | | |
|---|---|---|---|
| 5,457,609 A * | 10/1995 | Bhanot et al. ................ 361/814 |
| 6,235,991 B1 * | 5/2001 | Johnson .................... 174/70 R |
| 6,399,892 B1 | 6/2002 | Milkovich et al. |
| 6,516,513 B2 | 2/2003 | Milkovich et al. |
| 6,573,609 B2 | 6/2003 | Fjelstad et al. |
| 6,828,606 B2 | 12/2004 | Glebov |
| 7,095,121 B2 | 8/2006 | Tellkamp |
| 8,115,296 B2 | 2/2012 | Bolken et al. |
| 8,269,337 B2 | 9/2012 | Hu et al. |
| 8,305,101 B2 | 11/2012 | Desta et al. |
| 2004/0046248 A1 | 3/2004 | Waelti et al. |
| 2004/0166607 A1 | 8/2004 | Grigg |
| 2004/0206988 A1 | 10/2004 | Glebov |
| 2005/0151215 A1 | 7/2005 | Hauhe et al. |
| 2005/0239418 A1 * | 10/2005 | Koh et al. .................... 455/90.3 |
| 2005/0277228 A1 * | 12/2005 | Lee ............................. 438/113 |
| 2006/0145353 A1 | 7/2006 | Kirby et al. |

(Continued)

OTHER PUBLICATIONS

International Search Report issued in PCT/US13/74606, Apr. 21, 2014; 8 pages.

(Continued)

*Primary Examiner* — Michail V Datskovskiy
(74) *Attorney, Agent, or Firm* — Cantor Colburn LLP

(57) ABSTRACT

A package for active electronics is provided. The package includes a housing structure configured to house the active electronics, a connector element and an interposer element disposed to define a tie point between the housing structure and the connector element such that the tie point is remote from respective edges of the housing structure and the connector element.

17 Claims, 2 Drawing Sheets

(56) References Cited

U.S. PATENT DOCUMENTS

2012/0264320 A1 10/2012 Parrish et al.
2012/0291271 A1 11/2012 Rundle

OTHER PUBLICATIONS

Written Opinion t issued in PCT/US13/74606, Apr. 21, 2014; 8 pages.

* cited by examiner

LOAD SPREADING INTERPOSER

STATEMENT OF GOVERNMENT INTEREST

This invention was made with government support under contract number F33657-01-D-0026 awarded by the Department of Defense. The government has certain rights in the invention.

BACKGROUND

The present disclosure relates to a package for active electronics, and more specifically, to a package for active electronics having a load spreading interposer.

In antenna arrays, a transmit/receive (T/R) module is responsible for transmitting and receiving electromagnetic radiation to and from an external element. The T/R module is often provided in a T/R module package that includes a module having a substrate floor, ring frame and lid. This module contains the active electronics. A connector is laminated onto the lid of the module and the T/R module package is assembled by adhesion of the connector to the lid. The assembly process to adhere the connector to the lid is called lamination. Lamination uses pressure and an increased temperature to cure the epoxy that is provided between the connector and the lid.

For qualification, the entire module assembly with the connector has to be subject to a long period of thermal cycles. During this long period, the performance of the adhesive between the housing and the lid material may cause the lid material to thermally expand by a different degree from the connector material (the lid material may be made from Kovar™ and the connector material may be made from Ultum™, which are coefficient of thermal expansion (CTE) mismatched materials). Together, these effects often lead to delamination of the connector from the lid and may cause exposure of the connector pins extending from the connector to the substrate. Such delamination and exposure are failure modes of the T/R module package.

SUMMARY

According to one embodiment, a package for active electronics is provided. The package includes a housing structure configured to house the active electronics, a connector element and an interposer element disposed to define a tie point between the housing structure and the connector element such that the tie point is remote from respective edges of the housing structure and the connector element.

According to another embodiment, a package for active electronics is provided and includes a housing structure having a housing and a substrate porch on which pin connectors are disposed, a connector element having a spacer portion corresponding to the housing and a connector portion corresponding to the substrate porch and defining connector elements receptive of the pin connectors and an interposer element interposed between the housing and the spacer portion, the interposer element being adhered to the housing and fastened to the spacer portion.

According to another embodiment, a package for active electronics is provided. The package includes a housing structure having a housing for active electronics and a substrate porch on which pin connectors are disposed, a connector element having a spacer portion corresponding to the housing and having a first thickness and a connector portion corresponding to the substrate porch and defining connector elements receptive of the pin connectors, the connector portion having a second thickness, which is greater than the first thickness and an interposer element interposed between the housing and the connector element spacer portion, the interposer element being adhered to the housing and fastened to the connector element spacer portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
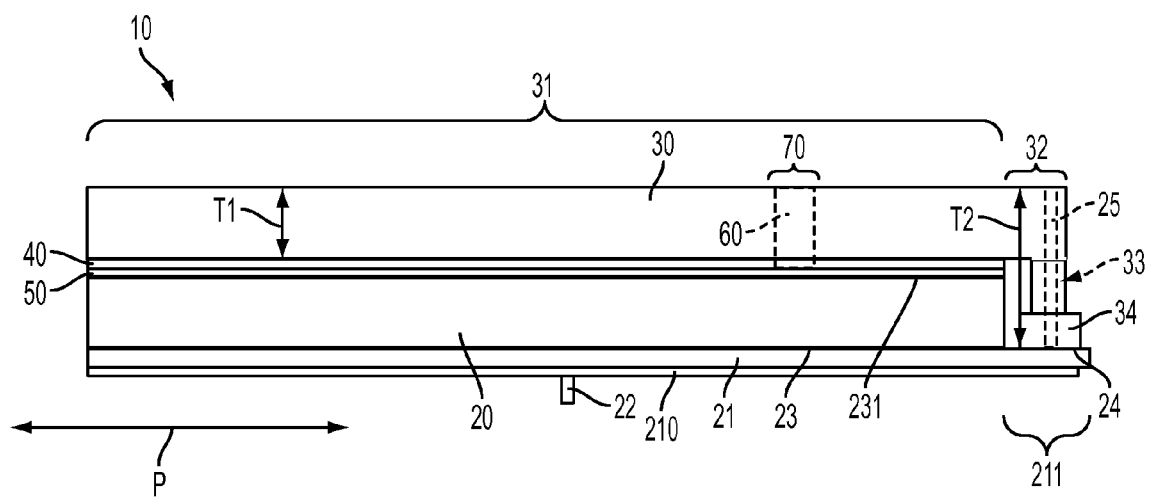
FIG. 1 is a side view of a package for housing active electronics.

The description provided herein relates to a package 10 for housing active electronics. The package 10 includes a housing structure 20 such as a T/R module, a connector element 30 and an interposer element 40. The interposer element 40 is disposed to define a tie point 70 between the housing structure 20 and the connector element 30 such that the tie point 70 is defined remotely from respective edges of the housing structure 20 and the connector element 30. With this construction, the package 10 reduces a peel moment exhibited in conventional T/R module packages, eliminates a need for bonding of CTE mismatched materials (i.e., Kovar™ and Ultum™), further eliminates a need for adhesive between the interposer element 40 and the connector element 30 and thus may rely upon a fastening of the interposer element 40 to the connector element 30.

Figure 2:
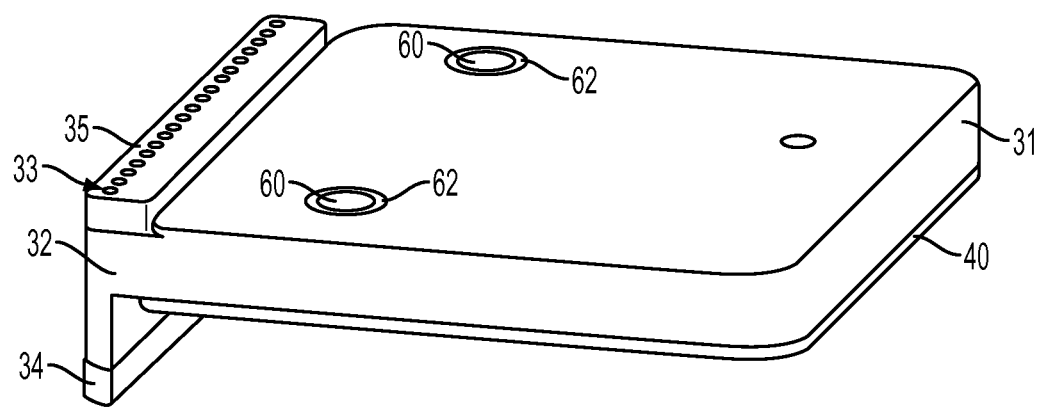
FIG. 2 is a downward, perspective view of a connector element and an interposer element of the package of FIG. 1.
Figure 3:
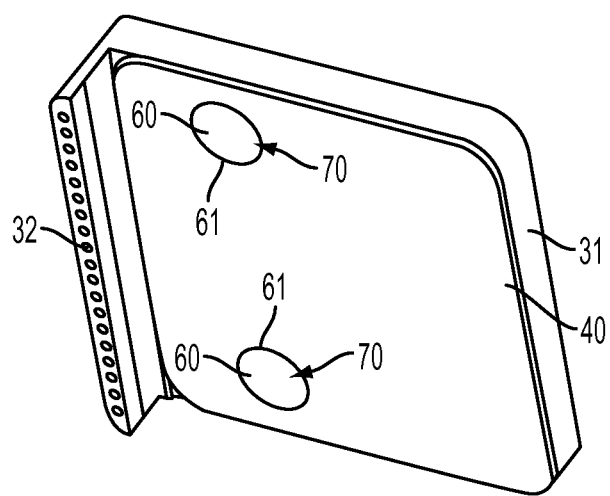
FIG. 3 is an upward, perspective view of a connector element and an interposer element of the package of FIG. 1.

With reference to FIGS. 1-3, a package 10 for housing active electronics is provided. The package 10 includes a housing structure 20, a connector element 30, an interposer element 40 and adhesive 50 (e.g., epoxy) interposed between the interposer element 40 and the housing structure 20. The housing structure 20 may be provided as a type of transmit/receive (T/R) module for transmitting and/or receiving electromagnetic energy. The housing structure 20 can have various shapes and sizes. For example, the housing structure 20 may be a volumetric body with four sidewalls, a lid 231 (to be described below) and a base. In particular, the housing structure 20 has a generally planar substrate 21 (i.e., the base), alignment pins 22 that extend from a backing layer 210 of the substrate 21 and a housing. The alignment pins 22 may be positioned to facilitate connection of the package 10 to an external apparatus (e.g., an antenna array).

The housing 23 is configured to house active electronics of the housing structure 20 and is shorter than the substrate 21 in a planar dimension P of the substrate 21. Thus a portion 211 of the substrate 21 extends beyond a side of the housing 21 whereby a surface of the portion 211 serves as a substrate porch 24. Pin connectors 25, such as spring-loaded connectors (e.g., pogo-pin connectors), are operably disposed on the substrate porch 24 and are electrically connectable to the active electronics housed in the housing 23.

The connector element 30 has a spacer portion 31 and a connector portion 32, which is connectable with the pin connectors 25. The spacer portion 31 is generally planar, corresponds in position, size and shape to the housing 23 of the housing structure 20 and has a first thickness T1. That is, when the connector portion 32 is connected with the pin connectors 25, the spacer portion 31 generally extends across a lid (or an upper surface) 231 of the housing 23 and may, in some cases, cover the lid 231 of the housing 23 completely.

In accordance with embodiments, the housing 23 may include a gold-plated metallic alloy, such as a nickel-cobalt ferrous alloy (e.g., Kovar™) or another similar alloy material. The lid 231 may be formed of Kovar™ or another similar material. The spacer portion 31 and the connector portion 32 may be formed of Ultum™ or another similar material.

As mentioned above, the connector portion 32 is connectable with the pin connectors 25 and may be configured and disposed to correspond to the substrate porch 24. Thus, in some embodiments, the connector portion 32 is a part of the spacer portion 31 as a flange that is formed to define connector elements 33. The connector elements 33 are elongate through-holes extending through the connector portion 32 whereby the connector elements 33 are formed to be receptive of the pin connectors 25. The connector portion 32 may have a second thickness T2, which is greater than the first thickness T1 by the thickness of the housing 23, the interposer element 40 and the adhesive 50.

The connector element 30 may further include a gasket 34 and a head piece 35 (see FIG. 2). The gasket 34 is disposed proximate to the interconnection of the connector portion 32 and the substrate porch 24 and serves to protect, seal and/or insulate the pin connectors 25 during at least assembly processes (e.g., heat and pressure treatments). The head piece 35 serves to support, secure and protect respective leads of the pin connectors 25.

The interposer element 40 is interposed between the housing 23 of the housing structure 20 and the spacer portion 31 of the connector element 30. In this location, the interposer element 40 may be adhered to the housing 23 by the adhesive 50 and may be fastened to the spacer portion 31. The interposer element 40 is generally planar and sized and shaped in correspondence with the corresponding sizes and shapes of the spacer portion 31 and the housing 23. The interposer element 40 may be formed of various materials, including, but not limited to stainless steel, but should generally be coefficient of thermal expansion (CTE) matched to the material(s) of the housing 23.

As shown in FIGS. 2 and 3, the interposer element 40 may be mechanically fastened to the spacer portion 31. In accordance with embodiments, this mechanical fastening may be achieved by way of one or more rivets or fasteners 60 that register with holes 61 formed in the interposer element 40 and extend through corresponding hollow sections 62 of the spacer portion 31. It will be understood that the material of the one or more rivets 60 is variable but may be CTE matched to that of the interposer element 40 and the housing 23.

In addition, for the case in which the one or more rivets 60 are used, the one or more rivets 60 should be remote from the edges of the interposer element 40, the spacer portion 31 and the housing 23. Thus, a tie point 70 between the spacer portion 31 and the housing 23 as defined by the respective locations of the one or more rivets 60 is similarly remote from respective edges of the spacer portion 31 and the housing 23.

As such, a peel moment is moved away from the respective edges of the lid portion of the housing 23.

In accordance with further embodiments and, as shown in FIGS. 2 and 3, respective corners of the spacer portion 31 and the interposer element 40 may be rounded. Thus, while a proximal edge of the interposer element 40 runs along an interior surface of the connector portion 32, the proximal corners of the interposer element 40 may recede from the interior surface of the connector portion 32 with increasing proximity to the ultimate edges of the connector portion 32. Similarly, while a proximal edge of the spacer portion 31 runs along an interior surface of the head piece 35, the proximal corners of the spacer portion 31 may recede from the interior surface of the head piece 35 with increasing proximity to the ultimate edges of the head piece 35.

In accordance with further aspects, a method of assembling the package 10 described above is provided. The method includes initially assembling the housing structure 20 and the connector element 30 and fashioning the interposer element 40. Holes 61 are defined in the interposer element 40, hollow sections 62 are defined in the connector element 30 and the interposer element 40 is fastened (e.g., mechanically) to the connector element 30 by way of rivets 60. The adhesive 50 is applied to the lid 231 of the housing 23 of the housing structure 20 and, thus, the interposer element 40 can be adhered to the housing structure 20 as the pin connectors 25 are received in the connector elements 33. Pressure treatments for insuring a stable connection between the pin connectors 25 and leads on the substrate porch 24 and heat treatments for curing the adhesive 50 and for quality control testing are subsequently performed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A package for active electronics, comprising:
a housing structure configured to house the active electronics;
a connector element; and
an interposer element adhered to the housing structure by epoxy, mechanically fastened to the connector element and disposed to define a tie point between the housing structure and the connector element such that the tie point is remote from respective edges of the housing structure and the connector element.

2. The package according to claim 1, wherein the housing structure comprises a T/R module.

3. The package according to claim 1, wherein the interposer element is mechanically fastened to a spacer portion of the connector element.

4. The package according to claim 1, wherein the interposer element is CTE matched to a material of the housing structure.

5. The package according to claim 1, wherein the interposer element comprises stainless steel.

6. A package for active electronics, comprising:
a housing structure having a housing and a substrate porch on which pin connectors are disposed;
a connector element having a spacer portion corresponding to the housing and a connector portion corresponding to the substrate porch and defining connector elements receptive of the pin connectors; and
an interposer element interposed between the housing and the spacer portion, the interposer element being adhered to the housing by epoxy and mechanically fastened to the spacer portion.

7. The package according to claim 6, wherein the pin connectors are configured to exert a resultant force on the substrate porchspring-loaded.

8. The package according to claim 6, wherein the interposer element is CTE matched to the housing.

9. The package according to claim 6, wherein the interposer element comprises stainless steel.

10. The package according to claim 6, wherein the interposer element is fastened to the spacer portion by one or more rivets, the one or more rivets being remote from edges of the interposer element.

11. A package for active electronics, the package comprising:
a housing structure having a housing for active electronics at a first side thereof and a substrate porch on which pin connectors are disposed at a second side thereof;
a connector element including a spacer portion having a first thickness at a first side thereof and a connector portion at a second side thereof, the respective first and second sides of the housing and the connector element corresponding with each other such that the spacer portion is disposed in positional correspondence with the housing and the connector portion is disposed in positional correspondence with the substrate porch,
the connector portion defining connector elements receptive of the pin connectors and having a second thickness, which is greater than the first thickness; and
an interposer element adjacent to a section of the connector portion, interposed between the housing and the spacer portion, adhered to the housing and fastened to the connector element spacer portion.

12. The package according to claim 11, wherein the pin connectors are configured to exert a resultant force on the substrate porch.

13. The package according to claim 11, wherein the connector element comprises a non-conductive material.

14. The package according to claim 11, wherein the interposer element is CTE matched to the housing.

15. The package according to claim 11, wherein the interposer element comprises stainless steel.

16. The package according to claim 11, wherein the interposer element is adhered to the housing by epoxy and mechanically fastened to the connector element spacer portion.

17. The package according to claim 11, wherein the interposer element is fastened to the connector element spacer portion by one or more rivets, the one or more rivets being remote from edges of the interposer element.

* * * * *